United States Patent
Kramer

(10) Patent No.: US 12,197,141 B2
(45) Date of Patent: Jan. 14, 2025

(54) SUCTION CLAMP, OBJECT HANDLER, STAGE APPARATUS AND LITHOGRAPHIC APPARATUS

(71) Applicant: ASML NETHERLANDS B.V., Veldhoven (NL)

(72) Inventor: Gijs Kramer, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 220 days.

(21) Appl. No.: 17/792,335

(22) PCT Filed: Dec. 18, 2020

(86) PCT No.: PCT/EP2020/087160
§ 371 (c)(1),
(2) Date: Jul. 12, 2022

(87) PCT Pub. No.: WO2021/144119
PCT Pub. Date: Jul. 22, 2021

(65) Prior Publication Data
US 2023/0121922 A1    Apr. 20, 2023

(30) Foreign Application Priority Data

Jan. 17, 2020 (EP) .................................... 20152451

(51) Int. Cl.
*G03F 7/00* (2006.01)
*B25J 11/00* (2006.01)
(Continued)

(52) U.S. Cl.
CPC ...... *G03F 7/70733* (2013.01); *G03F 7/70716* (2013.01); *H01L 21/6838* (2013.01); *H01L 21/68707* (2013.01); *B25J 11/0095* (2013.01)

(58) Field of Classification Search
CPC ........................ G03F 7/70691; H01L 21/6838
See application file for complete search history.

(56) References Cited

U.S. PATENT DOCUMENTS

| 4,529,353 | A | * | 7/1985 | Dean | ...................... | B65G 47/91 |
|  |  |  |  |  |  | 414/404 |
| 5,937,993 | A | * | 8/1999 | Sheets | .................. | B25B 11/005 |
|  |  |  |  |  |  | 269/21 |

(Continued)

FOREIGN PATENT DOCUMENTS

| CN | 1916718 | 2/2007 |
|---|---|---|
| EP | 3385792 | 10/2018 |

(Continued)

OTHER PUBLICATIONS

Machine translation of JP-H09314489-A (Year: 1996).*

(Continued)

*Primary Examiner* — Steven H Whitesell
(74) *Attorney, Agent, or Firm* — Pillsbury Winthrop Shaw Pittman, LLP

(57) ABSTRACT

A suction clamp for clamping an object. The suction clamp includes a base structure including a base and a connection area, and a first pad for receiving the object. The suction clamp further includes a resilient member connecting the first pad to the connection area of the base structure such that the first pad is moveable relative to the base between a receiving position for receiving the object and a clamping position for clamping the object, wherein the resilient member is adapted to bias the first pad to the receiving position. The suction clamp further includes a suction opening arranged in the base and adapted to be connected to a suction device for providing a suction force for clamping the object on the first pad.

20 Claims, 9 Drawing Sheets

(51) Int. Cl.
*H01L 21/683* (2006.01)
*H01L 21/687* (2006.01)

(56) References Cited

U.S. PATENT DOCUMENTS

| | | | |
|---|---|---|---|
| 6,020,964 | A | 2/2000 | Loopstra et al. |
| 6,517,130 | B1 | 2/2003 | Donoso et al. |
| 6,942,265 | B1 | 9/2005 | Boyd et al. |
| 6,952,253 | B2 | 10/2005 | Lof et al. |
| 2005/0052041 | A1 | 3/2005 | Bonora et al. |
| 2005/0122503 | A1 | 6/2005 | Ottens et al. |
| 2005/0218003 | A1 | 10/2005 | Wang et al. |
| 2007/0058173 | A1 | 3/2007 | Holzapfel |
| 2009/0096229 | A1 | 4/2009 | Bonora et al. |
| 2012/0107081 | A1 | 5/2012 | Furuta et al. |
| 2012/0235335 | A1 | 9/2012 | Hayashi et al. |
| 2015/0008689 | A1 | 1/2015 | Shin et al. |
| 2015/0008690 | A1 | 1/2015 | Kobuchi |
| 2015/0008691 | A1* | 1/2015 | Furuichi ............ B25J 15/0683 294/189 |
| 2015/0015014 | A1 | 1/2015 | Furuichi |
| 2015/0246447 | A1 | 9/2015 | Furuichi et al. |
| 2015/0255322 | A1 | 9/2015 | Ingram-Goble et al. |
| 2015/0357217 | A1 | 12/2015 | Wang et al. |
| 2016/0243707 | A1 | 8/2016 | Matsuhira |
| 2018/0350652 | A1* | 12/2018 | Matsuhira ............ H01L 21/677 |

FOREIGN PATENT DOCUMENTS

| | | | |
|---|---|---|---|
| JP | H08107136 | 4/1996 | |
| JP | 09314489 A * | 12/1997 | ........... B65G 49/061 |
| JP | H10086086 | 4/1998 | |
| JP | 2001179672 | 7/2001 | |
| JP | 2012099621 | 5/2012 | |
| JP | 2016157822 | 9/2016 | |
| TW | 311241 | 7/1997 | |
| WO | WO-2004100254 A1 * | 11/2004 | ........... B65G 49/061 |
| WO | 2015064613 | 5/2015 | |
| WO | 2018177341 | 10/2018 | |
| WO | 2019207202 | 10/2019 | |

OTHER PUBLICATIONS

Machine translation of WO-2004100254-A1 (Year: 2004).*
International Search Report and Written Opinion issued in corresponding PCT Patent Application No. PCT/EP2020/087160, dated Apr. 9, 2021.
Taiwanese Office Action Opinion issued in corresponding Taiwanese Patent Application No. 110100561, dated Aug. 30, 2021.
Office Action Issued in corresponding Japanese Patent Application No. 2022-543439, dated Jul. 25, 2023.

* cited by examiner

SUCTION CLAMP, OBJECT HANDLER, STAGE APPARATUS AND LITHOGRAPHIC APPARATUS

CROSS-REFERENCE TO RELATED APPLICATIONS

This application is the U.S. national phase entry of PCT Patent Application No. PCT/EP2020/087160 which was filed on Dec. 18, 2020, which claims the benefit of priority of European Patent Application No. 20152451.9 which was filed on Jan. 17, 2020, and which is incorporated herein in its entirety by reference.

FIELD

The present invention relates to the technical field of clamping an object such as a substrate or wafer. In particular, the invention relates to a suction clamp, an object handler, a stage apparatus and a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

While the pattern is being projected on the substrate, the substrate is typically mounted on a substrate support. To arrange the substrate on the substrate support a plurality of support members are arranged to receive the substrate. The support members may comprise one or more suction clamps for clamping the substrate using a clamping force. After receiving the substrate, the support members are simultaneously moved vertically downwards until the substrate is supported by the substrate support.

Typically, the substrate is arranged onto said support members by an object gripper. The gripper may also comprise one or more suction clamps for clamping the substrate using a clamping force.

Developments in recent years, such as so-called 3DNAND and 3D Xpoint substrates, have led to the substrates more often not being flat but having an out-of-plane shape, e.g. warped or bended. This may e.g. be a consequence of an increasing number of layers which have internal stresses. It has been observed that such warped or bended substrates are not always clamped properly by conventional suction clamps of the object handler and/or support pins.

SUMMARY

It is an object of the present invention to at least provide an alternative for prior art devices. It is an object of the invention to mitigate one or more disadvantages of the prior art devices. In particular, it is an object of the invention to provide improved clamping for bended or warped objects.

According to a first aspect of the invention, one or more of the above objects are achieved with a suction clamp for clamping an object. The suction clamp comprises a base structure comprising a base and a connection area, and a first pad for receiving the object. The suction clamp further comprises a resilient member connecting the first pad to the connection area of the base structure such that the first pad is moveable relative to the base between a receiving position for receiving the object and a clamping position for clamping the object, wherein the resilient member is adapted to bias the first pad to the receiving position. The suction clamp further comprises a suction opening arranged in the base and adapted to be connected to a suction device for providing a suction force for clamping the object on the first pad.

As the resilient member biases the first pad towards the receiving position, the first pad is arranged in said receiving position when an object is arranged onto the suction clamp. The object may e.g. be a substrate or a wafer. Even when the object has a warped surface, it is ensured that at least a lower part of the warped surface of the object is engaged by the first pad. As the resilient member allows the first pad to move towards the clamping position, at least where it is engaging the warped surface, also a higher part of the warped surface is engaged by the first pad. As the first pad is then moved towards the clamping position, the warped surface is substantially straightened by the suction force. The object can be properly clamped in a well-defined position.

In an embodiment, the suction clamp further comprises a pressure drop member arranged to, when the suction force is provided via the suction opening, cause an inner pressure downstream of the pressure drop member to be lower than an ambient pressure upstream of the first pad. Advantageously, the pressure drop member increases the suction force exerted on the object.

In an embodiment, the pressure drop member is arranged in a fixed position relative to the base, and wherein the at least in the receiving position of the first pad a gap is present between the first pad and the pressure drop member. Advantageously, in this embodiment the pressure drop member is wear resistant.

In an embodiment, the pressure drop member is arranged between the suction opening and the first pad. It has been found that this arrangement is beneficial for the effect of the pressure drop member on the clamping force exerted on the object.

In an embodiment, the pressure drop member is arranged adjacent of the first pad, wherein in a clamping position of the first pad, said first pad and pressure drop member are adjoining Advantageously, in the clamping position any leak of suction air is reduced.

In an embodiment, the first pad is a ring-shaped element, optionally circular or elliptically ring-shaped, and/or wherein the pressure drop member is a ring-shaped element, optionally circular or elliptically ring-shaped. This arrangement has been found to be advantageous to clamp the object.

In an embodiment, the first pad comprises at least a first zone and a second zone, wherein the first zone is adapted to be able to move from the receiving position to the clamping position while the second zone remains in the receiving position. Advantageously, when the object has a warped surface, the first zone can first engage a lower part of the warped surface, while the second zone engages a higher part of the warped surface when the first zone has already been moved to the clamping position. As such, the warped surface can be clamped better.

In an embodiment, the base structure comprises a pad receiving area adapted to engage the first pad when the first pad is in the clamping position. Advantageously, the position of the first pad is well defined in the clamping position, and as such the position of the object as well.

In an embodiment, a distance the first pad is adapted to move between the receiving position and the clamping position is less than 0.5 mm, preferably less than 0.3 mm, e.g. approximately 0.2 mm. It has been found that this is sufficient for relatively warped objects, while still allowing the position of the object to be well defined.

In an embodiment, the resilient member is a spring, e.g. a leaf spring. This has been found to be an arrangement that is relatively simple to produce, while achieving satisfactory results.

In an embodiment, the base structure comprises a first protrusion, wherein the first protrusion comprises the connection area. Advantageously, the resilient member can easily be attached to the protrusion, e.g. without hindering or being hindered by other components.

In a second aspect of the invention, the invention relates to a suction clamp having at least a first pad, wherein the first pad has an asymmetric shape which, when seen in top view of the suction clamp, comprises a first end having a first centre of mass, a second end having a second centre of mass, a middle part between the first end and the second end having a third centre of mass, the middle part having a first border part on a first side and a second border part on a second side, wherein the first border part and the second border pad part are parallel to each other, wherein, when seen in a direction from the first side to the second side, the third centre of mass is located between the first centre of mass and the second centre of mass. It has been found that the clamping is approved with a suction clamp according to the second aspect.

The second aspect of the invention may be combined with the first aspect, but the invention also relates to the second aspect as such.

In an embodiment, the first end comprises a first non-parallel border and the second end comprises a second non-parallel border, wherein the first non-parallel border and the second non-parallel border are adapted to be non-concentric to the object.

In a further embodiment of the second aspect, when seen in a direction perpendicular to the direction from the first side to the second side, the second end is longer than the first end.

The invention further relates to an object gripper comprising at least a first suction clamp according to the first and/or second aspect of the invention. Advantageously, the object can be clamped better, reducing movement of the object relative to the object gripper during movement of said object gripper.

In an embodiment the object gripper further comprises a second suction clamp according to the first and/or second aspect of the invention, and a third suction clamp. Advantageously, the object can be clamped better, reducing movement of the object relative to the object gripper during movement of said object gripper.

The invention further relates to an object handler comprising an object gripper according to the invention, and a suction device connected to the suction opening of the first suction clamp, and/or the second suction clamp, and/or the third suction clamp. Advantageously, the object can be clamped better, allowing the object handler to position the object more accurately.

The invention further relates to a stage apparatus for receiving an object, said stage apparatus comprising an object support, and an object gripper an object handler according to the invention, wherein the object gripper is configured to arrange the object above the object support. Advantageously, the object can be position more accurately above the object support.

The invention further relates to a lithographic apparatus comprising a stage apparatus according to the invention for receiving an object comprising a substrate, and a projection system for protecting a pattern onto said substrate. Advantageously, the pattern can be projected more accurately, because the object has been positioned more accurately.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
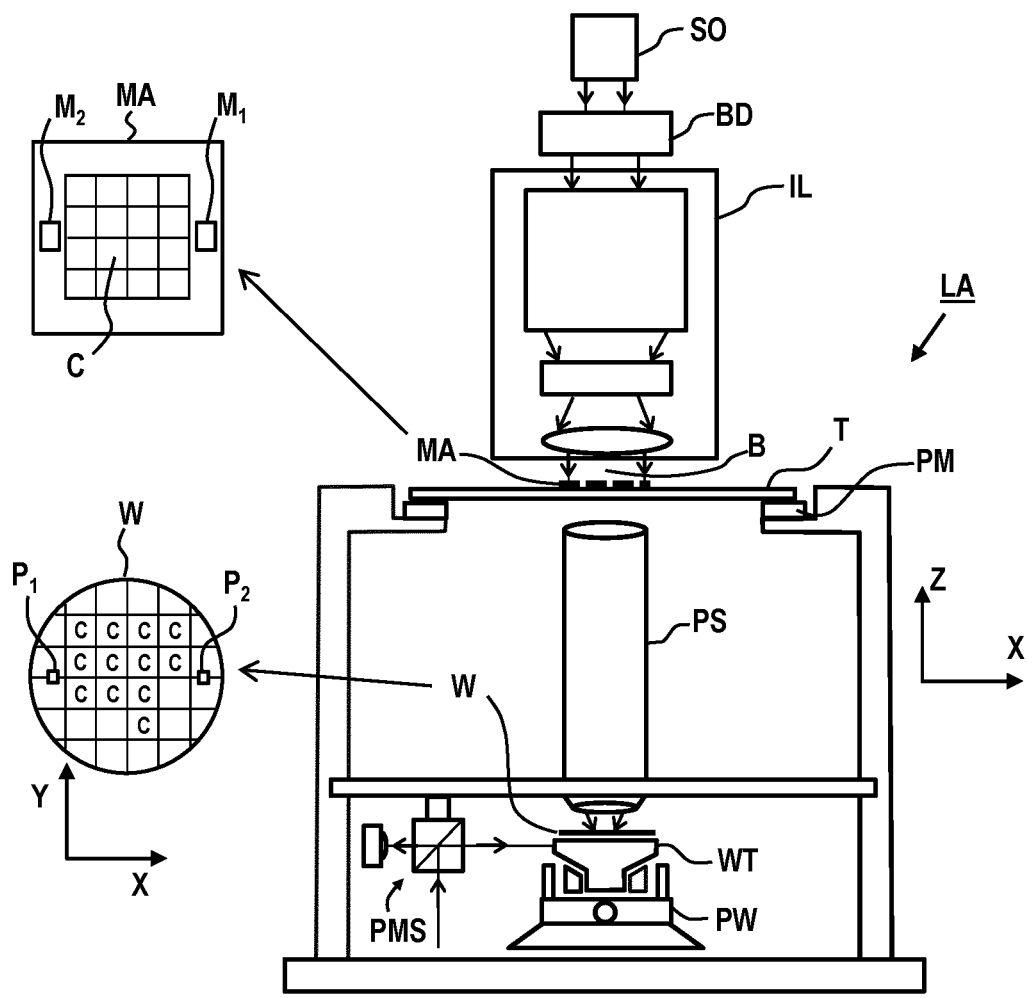
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
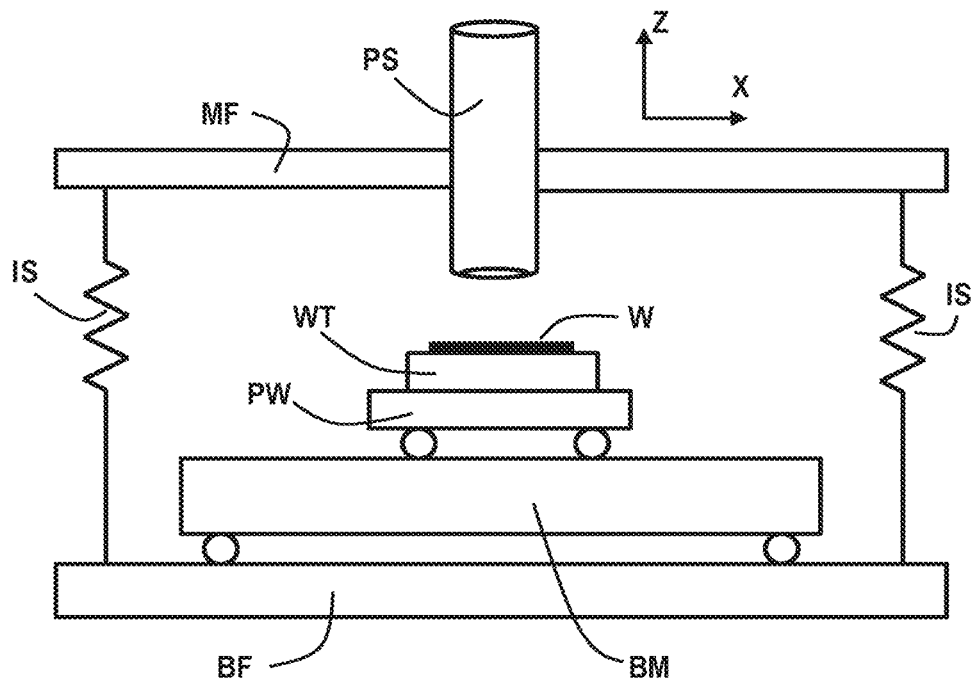
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
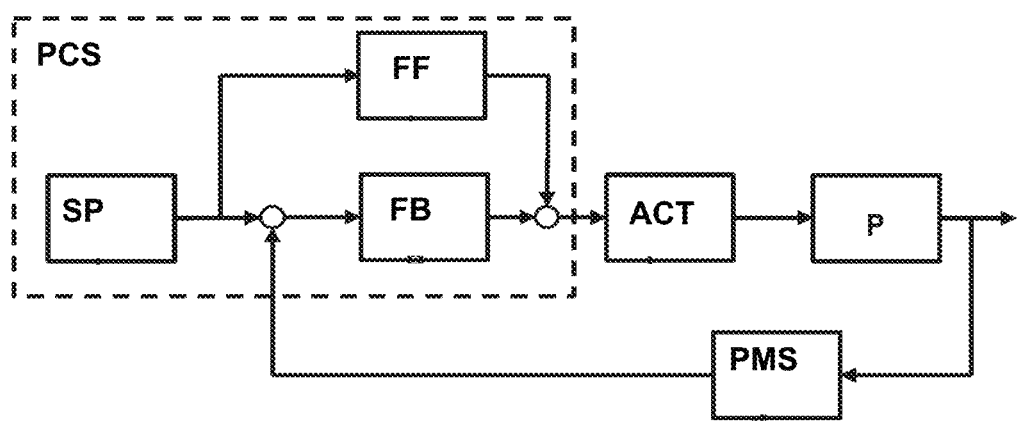
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4A:
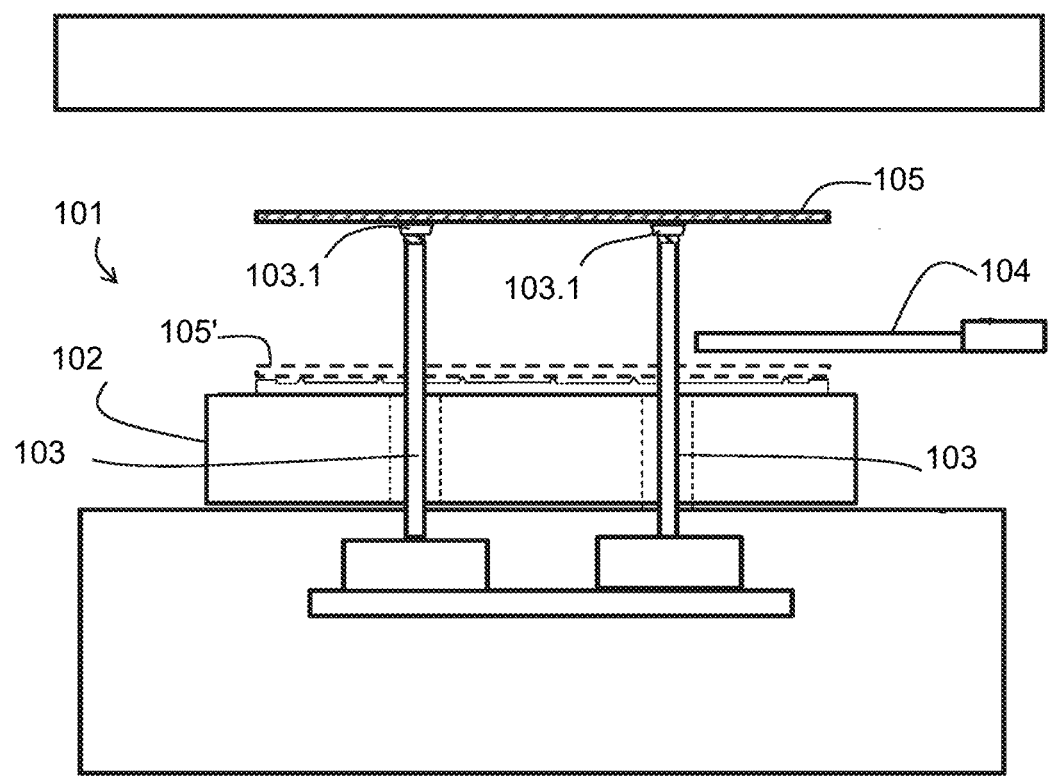
FIG. 4a shows a side view of a stage apparatus which comprises an object support.

FIG. 4a shows a side view of a stage apparatus 101 which comprises an object support 102 configured to support an object 105, which e.g. is a substrate W or a wafer. The object support 102 may e.g. be supported by another support as shown in FIG. 4a. The stage apparatus 101 e.g. comprises a plurality of support members 103 for supporting the object 105, arranged to receive the object 105 from an object gripper 104 and to arrange the object 105 on the object support 102 and/or vice versa. The support members 103 are moveable in at least a vertical direction z which is perpendicular to a first plane xy. In the shown embodiment, the stage apparatus 101 comprises three support members 103 of which two are visible in the side view shown in FIG. 4a. The three support members 103 are preferably arranged such that when seen in top view an imaginary equilateral triangle can be drawn wherein the support members 103 are situated on the corners. It is noted however that any suitable number of support members 103 may be applied in any suitable arrangement.

Loading the object 105, i.e. arranging the object 105 on the object support 102, can then e.g. be accomplished as follows. In the situation shown in FIG. 4a the object 105 is supported by the support members 103 and an object gripper 104 has been partially retracted. Prior to this situation the object 105 was supported by the object gripper 104, which arranged the object 105 above the object support 102 to provide the object 105 to the stage apparatus 101. The object gripper 104 may e.g. be driven by a robot, e.g. a multi-axis robot arm, which is part of an object handler that provides the object 105. The support members 103 are then moved vertically upwards from a retracted position wherein they are arranged below the object support 102 to a supporting position shown in FIG. 4a. During said vertically upwards movement the support members 103 engage the object 105. Once the object 105 is supported by the support members 103 the gripper 104 can be retracted to correspond with the situation shown in FIG. 4a. When the gripper 104 is retracted in horizontal direction, the support members 103 are then moved vertically downwards until the object 105 is arranged on the object support 102, as indicated by the dashed lines 105'.

The object 105 can be unloaded in a similar manner, e.g. after the pattern has been projected on the object 105. While the object 105 is arranged on the object support 102, the support members 103 are in the retracted position below a top surface of the object support 102. The support members 103 can be moved vertically upwards in the vertical direction z until they engage the object 105, such that the object 105 is supported by the support members 103 instead of the object support 102. The support members 103 can then be further moved vertically upwards in the vertical direction z until they reach the supporting position as shown in FIG. 4a again. The object gripper 104 can then be moved below the object 105 to support the object 105. For example, the object gripper 104 can be moved vertically upwards after being arranged under the object 105 in order the engage the object. It is also possible to move the support members 103 vertically downwards after the object gripper 104 has been arranged below the object 105 until the object gripper 104 engages the object 105. Alternatively object gripper 104 can be moved above the object 105. For example, the object gripper 104 can be moved vertically downwards after being arranged above the object 105 in order the engage the object. It is noted that in an embodiment the object gripper used for unloading of the object 105 may be an object gripper which is different from the object gripper 104 used for providing the object 105, e.g. both grippers may be arranged on opposite sides of the object 105, e.g. on the left and right side in FIG. 4a.

Figure 4B:
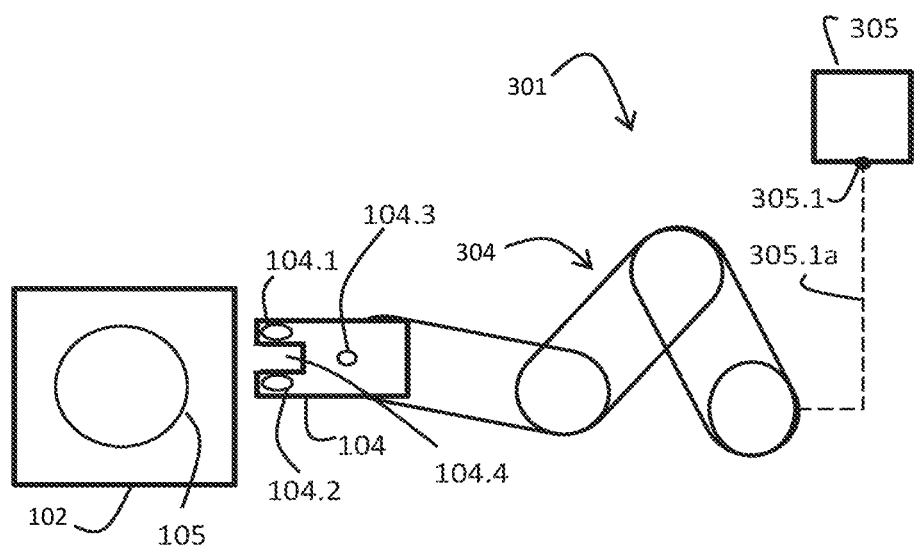
FIG. 4b schematically shows an object handler in a top view.

FIG. 4b schematically shows an object handler 301 in a top view. It is noted that for the sake of clarity FIG. 4b does not depict all components, but focuses on those relevant for the explanation that follows. The object handler 301 comprises a robot arm 304, configured to provide the object 105 to the object support 102, and a control unit 305. FIG. 4b further shows that the control unit 305 has a first output terminal 305.1 for controlling the robot arm 304 with a first control signal 305.1a. The robot arm 304 comprises the object gripper 104, and the position of the object gripper 104 can thus be controlled as such. Since the object gripper 104 arranges the object 105 above the object support 102 for the support members to engage the object 105, the position of the object 105 relative to the object support 102 can be controlled as such. The robot arm 304 may further be able to repeat its movement repetitively with high precision, such that each object 105 can be arranged on substantially the same position relative to the object support 102.

FIG. 4a further shows that the support members 103 comprise suction clamps 103.1, and FIG. 4b shows that the object gripper 104 in the shown embodiment comprises a first suction clamp 104.1, a second suction clamp 104.2, and a third suction clamp 104.3. A recess 104.4 may further be provided in the object gripper 104, e.g. to allow the support members of the stage apparatus to engage the object 105. The suction clamps 103.1, 104.1, 104.2, 104.3 are fluidly connected to one or more non-shown suction sources, which provide a suction force on the object 105. However, when the object 105 has a warped surface, the suction clamps 103.1, 104.1, 104.2, 104.3 may not be able to clamp the object 105 properly. This is illustrated by FIG. 5a, in which the object gripper 104 is shown in a side view, wherein the first suction clamp 104.1 and the third suction clamp 104.3 are visible.

Figure 5A:
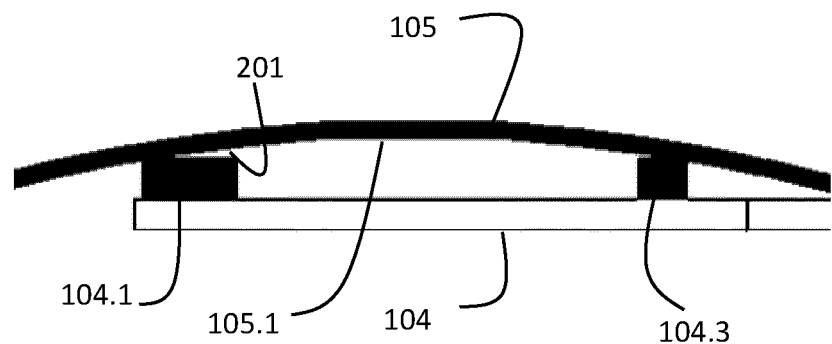
FIG. 5a shows a side view of an object gripper and a warped object.

FIG. 5a shows that, due to a warped surface 105.1 of the object 105, the first suction clamp 104.1 is not completely covered by the object 105, resulting in a leak 201. Through the leak 201, ambient air is sucked in by the suction source, resulting in a lower suction force exerted onto the object 105.

Figure 5B:
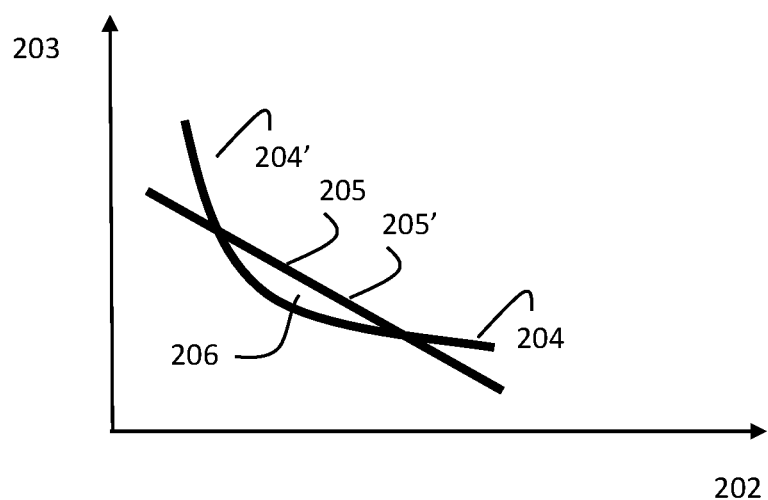
FIG. 5b shows a graph of a suction force and a deformation force as a function of a size of a leak.

To properly clamp the object 105, the first suction clamp 104.1 should be covered as much as possible by the object 105. FIG. 5b shows a graph with on the horizontal axis 202 the size of the leak 201, and on the vertical axis 203 a force expressed in Newton. A first graph 204' shows the suction force 204 exerted on the object 105, which is approximately inversely proportional to the leak 201. A second graph 205' shows a deformation force 205 required to deform the object 105 and as such suck the object 105 towards the first suction clamp 104.1. The deformation force 205 is approximately proportional to the stiffness of the object 105, which in turn increases as the leak 201 decreases, since more force is required for further deformation.

Due to increased warpage of the object 105, a situation as shown in FIG. 5b may occur. In the area 206 wherein the suction force 204 is smaller than the deformation force 205, the object 105 will no longer be deformed, and will therefore not be clamped sufficiently. When this e.g. happens with the first suction clamp 104 of the object gripper, the object 105 may move relative to the object gripper during movement of said object gripper, e.g. in a horizontal direction. This may result in an inaccurate position of the object 105 relative to the object support 102, and eventually in an inaccurate projection of the pattern onto the object 105.

Figure 6A:
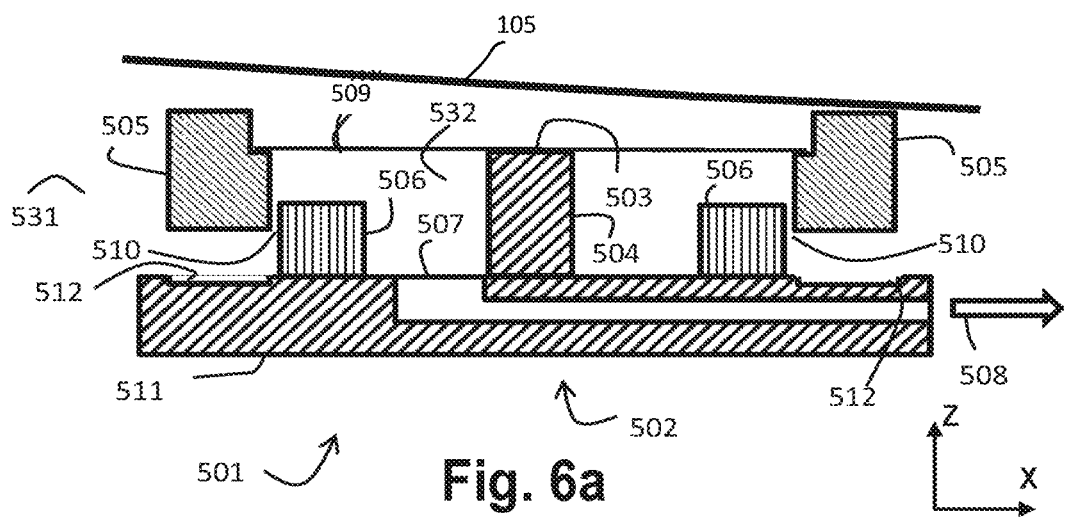
FIGS. 6a-6c show a suction clamp according to a first aspect in a schematic cross-section.
Figure 6B:
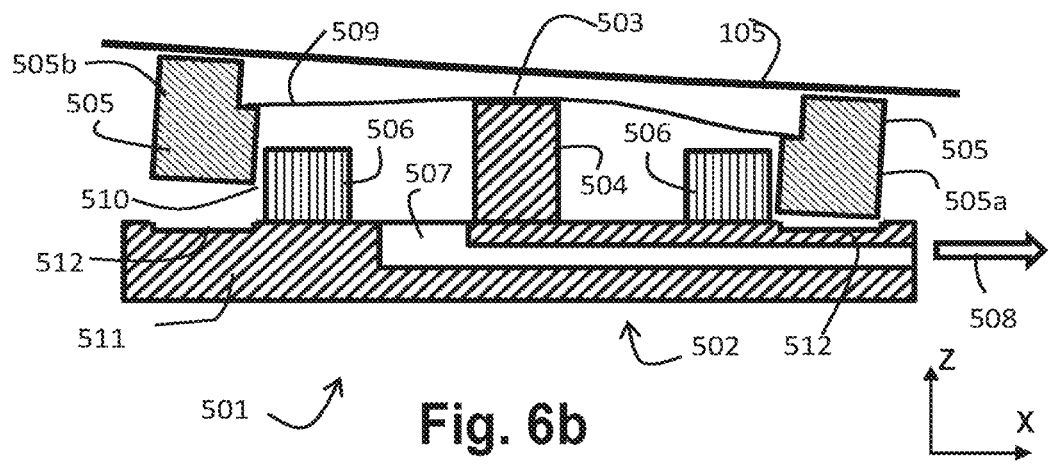
Figure 6C:
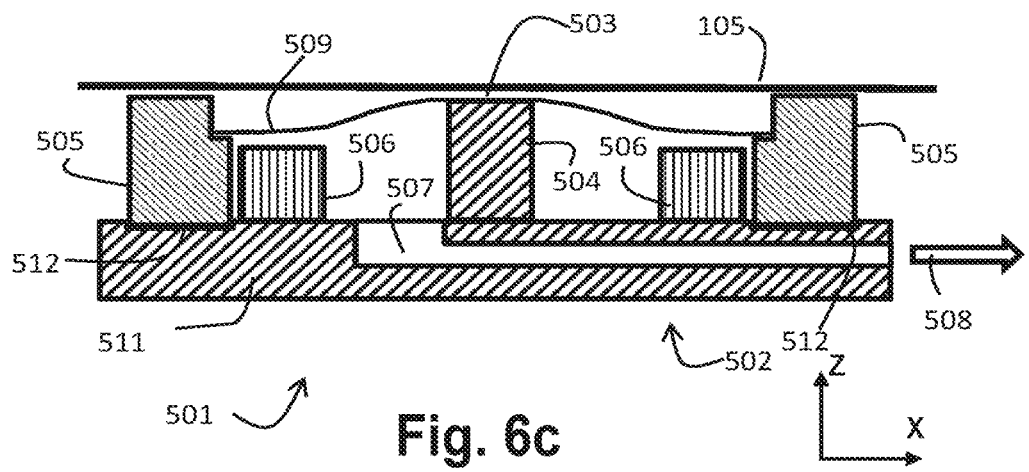
Figure 6D:
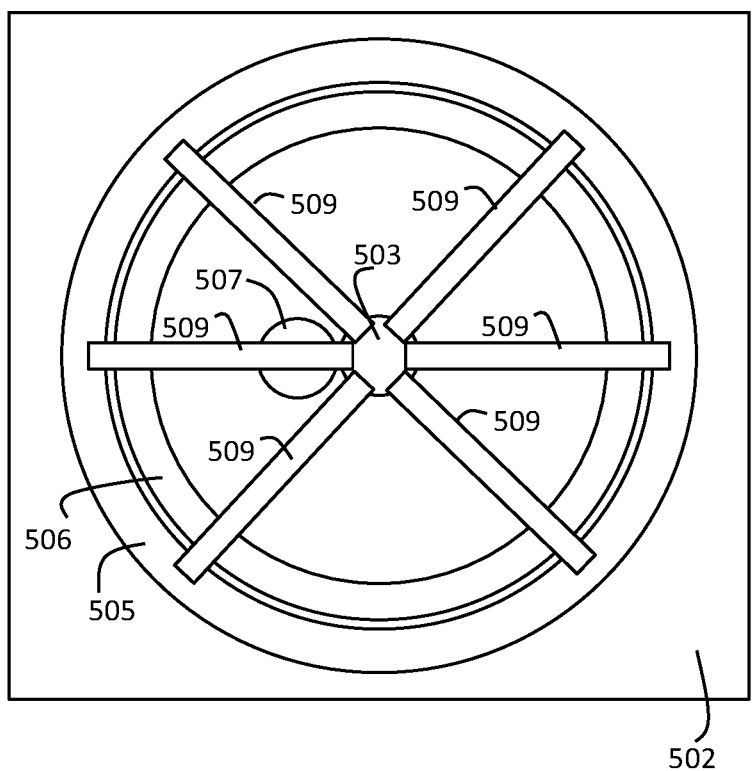
FIG. 6d shows a schematic top view of the suction clamp as shown in FIGS. 6a-6c.

According to a first aspect, the invention therefore proposes a suction clamp 501 of which an example is shown in FIG. 6a-6c in a schematic cross section. FIG. 6d further shows a schematic top view of the suction clamp 501. The suction clamp 501 comprises a base structure 502. The base structure 502 comprises a base 511 and a connection area 503. The suction clamp 501 comprises a first pad 505 for receiving an object 105. The suction clamp 501 further comprises a resilient member 509 connecting the first pad 505 to the connection area 503 of the base structure 502 such that the first pad 505 is moveable relative to the base 511 between a receiving position (situation as shown in FIG. 6a) for receiving the object 105 and a clamping position (situation as shown in FIG. 6c) for clamping the object 105. The resilient member 509 is adapted to bias the first pad 505 to the receiving position. The suction clamp 501 further comprises a suction opening 507 arranged in the base 511 and adapted to be connected to a suction device (not shown) for providing a suction force for clamping the object 105 on the first pad 505.

FIG. 6a shows the first pad 505 in the receiving position. Since the resilient member 509 is adapted to bias the first pad 505 towards this position, this will be the situation before any object 105 engages the first pad 505. The resilient member 509 exerts a spring force on the first pad 505 having at least an upward component. The object 105 may e.g. be a substrate or a wafer, having a warped surface. It is noted that the suction clamp 501 is considerably smaller than the object 105, and that the curvature of the warped surface may be practically negligible on the part of the object 105 that is shown in FIG. 6a-6c. The object 105 is therefore schematically shown as a straight line. However, as can be seen, because the object 105 is warped, the object 105 is not parallel with the base 511. This results in the situation shown in FIG. 6a, wherein the object 105 first engages the first pad 505 on what in FIG. 6a-6c is the right-hand side.

The first pad 505 is exposed to a downward force, which includes the suction force provided through the suction hole 507 and, when the object 105 engages the first pad, the weight of the object 105. When the downward force exceeds the upward component of the spring force exerted by the resilient member 509, the first pad 505 is moved downwards. Preferably, the resilient member 509 allows at least a part of the first pad 505 to move towards the clamping position, even when the suction force is not provided. Since in FIG. 6a, the object 105 only engages the first pad 505 on the right-hand side, the first pad 505 will initially only move downwards on the right-hand side, until the situation in FIG. 6b arises. In FIG. 6b, the first pad 505 has been moved downward on the right-hand side, until the object 105 also engages the first pad 505 on the left-hand side.

Advantageously, as the resilient member 509 allows a part of the first pad 505 to move downwards, a bigger part of the first pad 505 is covered by the object 105. Any leak has therefore been reduced, and the suction force—provided by the suction device via the suction opening 507—exerted onto the object 105 has been increased, in comparison to a conventional suction clamp. Now, also the left-hand side of the first pad 505 starts moving downwards, until the situation in FIG. 6c has been reached. As the suction force exerted onto the object 105 is larger than the deformation force, the object 105 is deformed and also moved downwards. The result in FIG. 6c shows a situation wherein the object 105 has been satisfactorily clamped.

The base structure 502 may e.g. be arranged on or embedded by the object gripper or support member. In the shown example, the base structure 502 comprises a first protrusion 504. The first protrusion 504 comprises the connection area 503. Although FIG. 6a-6c show the first protrusion 504 in a centre of the suction clamp 501, this is not required. For example, the first protrusion 504 can also be arranged radially outward of the first pad 505.

Optionally, the first pad 505 is made from an elastomer, e.g. an amorphous plastic, such as a polyetherimide. For example, the first pad 505 may be made from the material commercially available under the tradename Semitron 410 ESD. The resilient member 509 may be a spring, e.g. a leaf spring. The resilient member 509 may e.g. have a spring constant between 1-3 N/mm, e.g. approximately 2 N/mm. A distance the first pad is adapted to move between the receiving position and the clamping position may e.g. less than 0.5 mm, preferably less than 0.3 mm, e.g. approximately 0.2 mm, such that the position of the object 105 is well defined, both in horizontal and vertical direction.

The suction opening 507 is connected to a suction device, which may e.g. be a pump or compressor, e.g. a vacuum pump. The suction device may be arranged to suck air into a channel, away from the suction clamp 501, as is indicated by arrow 508 in FIG. 6a-6c.

FIG. 6a-6c show that, optionally, the suction clamp 501 further comprises pressure drop member 506. The pressure drop member 506 is arranged to, when the suction force is provided via the suction opening 507, cause an inner pressure downstream 532 of the pressure drop member 506 to be lower than an ambient pressure upstream 531 of the first pad 505. The object 105 is exposed to the ambient pressure on an outer side, and to the inner pressure, or at least a pressure partly determined by said inner pressure, on an inner side. By providing a pressure drop between said inner pressure and ambient pressure with the pressure drop member 506, the inner pressure is reduced. The suction force exerted on the object 105 is as such increased.

In some embodiments, the pressure drop member 506 may be embodied as a seal between the first pad 505 and the base structure 502. In the shown example, however, the pressure drop member 506 is arranged in a fixed position relative to the base 511, and at least in the receiving position of the first pad 505, a gap 510 is present between the first pad 505 and the pressure drop member 506. The pressure drop member 506 may e.g. be arranged on the base 511, e.g. being made out of the same material as the first pad 505. Alternatively, the pressure drop member 506 may e.g. be an integral part of the base structure 502, e.g. being a protrusion extending from the base 511.

Air is sucked through the gap 510 into the suction opening 507 by the suction device. Since the gap 510 is relatively small, a relatively high pressure drop can be achieved. This arrangement is sometimes referred to as a "leaky seal". Advantageously, this embodiment does not require physical contact between the first pad 505 and the pressure drop member 506. As such, the pressure drop member 506 is not prone to wear by movement of the first pad 505, unlike e.g. conventional seals.

FIG. 6a-6c show the pressure drop member 506 between the suction opening 507 and the first pad 505, in particular being radially inward of the first pad 505. This has been found to be a practical arrangement resulting in satisfactory results. Nevertheless, it is also possible to arrange the pressure drop member 506 radially outward of the first pad 505.

FIG. 6c further shows that the pressure drop member 506 is arranged adjacent of the first pad 505. Optionally, in clamping position of the first pad 505, said first pad 505 and pressure drop member 506 are adjoining. As such, the gap 510 is closed, and there is no leak of air through the gap 510 in the clamping position.

FIG. 6d illustrates that in the shown example the first pad 505 and the pressure drop member 506 are ring-shaped elements, in particular circular. However, the ring-shaped elements may be shaped elliptically or in other suitable shapes as will be explained further herein with reference to FIGS. 8a-8b.

Also shown in FIG. 6d, is that the resilient member 509 may e.g. comprise several branches connecting the first pad 505 with the connection area 503.

Best visible in FIG. 6b, is further that optionally the first pad 505 comprises at least a first zone 505a and a second zone 505b, wherein the first zone 505a is adapted to be able to move from the receiving position to the clamping position while the second zone 505b remains in the receiving position.

FIG. 6a-6c further show that the base structure 502 comprises an optional pad receiving area 512 adapted to engage the first pad 505 when the first pad 505 is in the clamping position, as is shown in FIG. 6c. In the shown example, the pad receiving area 512 is arranged in the base 511, in particular as a recess. The pad receiving area 512 is a fixed, known position on the base structure 502, and thus in a fixed, known position relative to the connection area 503. As the first pad 505 engages the pad receiving area 512 in the clamping position, the position of the first pad 505 is as such also known. Consequently, the object 105 can be positioned with high accuracy.

Figure 7:
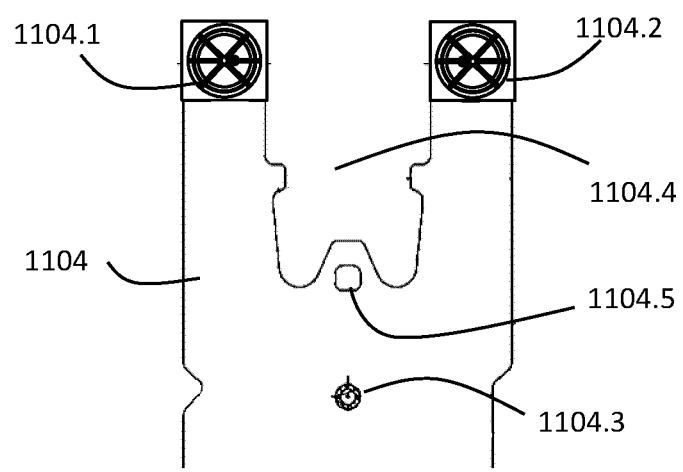
FIG. 7 shows an object gripper according to an embodiment of the invention.

FIG. 7 shows an object gripper 1104 according to the invention. In the shown example, the object gripper 1104 comprises a first suction clamp 1104.1, a second suction clamp 1104.2, and a third suction clamp 1104.3, as well as a recess 1104.4. A centre of the object may be arranged above centre point 1104.5. In accordance with the invention, at least one of the suction clamps 1104.1, 1104.2, 1104.3 is embodied according to the invention. In particular, in the shown embodiment the first suction clamp 1104.1 and the second suction clamp 1104.2 are embodied according to invention.

In the shown example, the first suction clamp 1104.1 and the second suction clamp 1104.2 are arranged at an outer ends of the object gripper 1104. The third suction clamp 1104.3 is arranged at a central portion of the object gripper 1104. FIG. 7 further shows that the third suction clamp 1104.3 may e.g. be smaller than the first suction clamp 1104.1 and second suction clamp 1104.2 In addition, the third suction clamp 1104.3 can optionally not be embodied according the invention. That is, the third suction clamp 1104.3 may be embodied without a resilient member that allows a first pad to move between a receiving position and a clamping position.

Figure 8A:
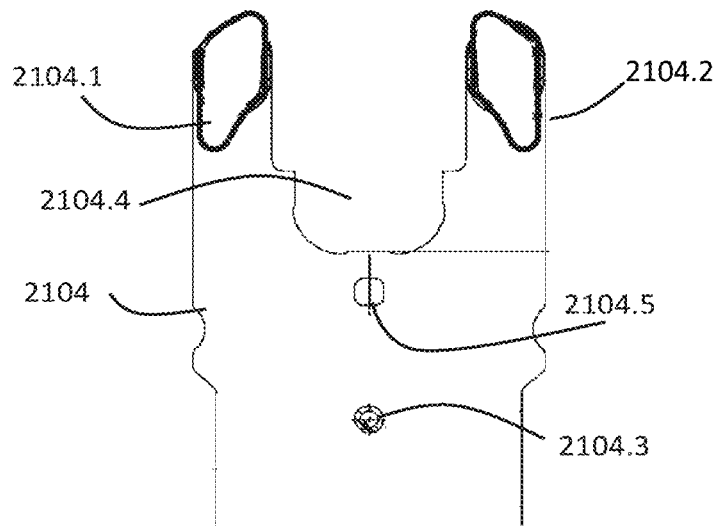
FIGS. 8a-8b illustrate a second aspect of the invention.
Figure 8B:
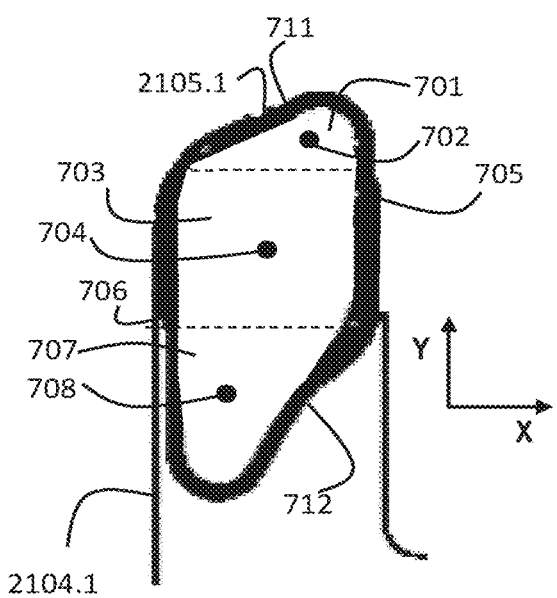

FIG. 8a and FIG. 8b illustrate a second aspect of the invention, which relates to a suction clamp 2104.1, 2104.2 having a particular shape. FIG. 8a shows an object gripper 2104 having a first suction clamp 2104.1 and a second suction clamp 2104.2 embodied according to the second aspect, and a third suction clamp 2104.3. FIG. 8b shows an enlarged view of the first suction clamp 2104.1. It is noted that for the sake of clarity, only a first pad 2105.1 is shown for the first suction clamp 2104. However, the first pad 2105.1 may be embodied according to the first aspect of the invention, although this is not required.

The shape of the first pad 2105.1 according to the second aspect may be described as follows: the first pad 2105.1 has an asymmetric shape which, when seen in top view of the suction clamp 2104.1, comprises a first end 701 having a first centre of mass 702, and a second end 707 having a second centre of mass 708. The first pad 2105.1 further has a middle part 703 between the first end 701 and the second end 707 having a third centre of mass 704. The middle part 703 has a first border part 705 on a first side and a second border part 706 on a second side. The first border part 705 and the second border part 706 are arranged at borders of the object gripper 2104 in what in FIG. 8b is the x-direction. In the shown example the first border part 705 and the second border part 706 are both straight pad parts and are parallel to each other. In FIG. 8b, the first side is the right-hand side and the second side is the left-hand side. In accordance with the third aspect, when seen in a direction from the first side to the second side, the third centre of mass 704 is located between the first centre of mass 702 and the second centre of mass 708.

Preferably, the first end 701 comprises a first non-parallel border 711 and the second end 707 comprises a second non-parallel border 712, wherein the first non-parallel border 711 and the second non-parallel border 712 are adapted to be non-concentric to the object.

It can be further be seen that, optionally, when seen in a direction perpendicular to the direction from the first side to the second side, the second end 707 is longer than the first end 701.

Several factors may contribute to the advantageous effect of the suction clamp 2104.1, 2401.2 in accordance with the second aspect, in particular when used for clamping warped objects. First, when compared to conventional suction clamps, the surface area is approximately maintained. Therefore, the total clamping force is maintained. Second, the distance—in what in FIG. 8b is the y-direction—between outer points of the first pad 2105.1 and the suction opening is increased. This enlarges the pneumatic torque exerted on the object, and as such increases the force to deform the object in the required direction. Third, the first end 701 has the first non-parallel border 711, and the second end 707 has the second non-parallel border 712, which form support points for the object. The first non-parallel border 711 and the second non-parallel border 712 are arranged at a radial distance from a centre point 1104.5—corresponding with the centre of the object—at which a radial distance between the first non-parallel border 711 and the second non-parallel border 712 is relatively small. A total leak when the object is not yet clamped is minimized. As such, bowl and umbrella shaped objects have been found to be better clamped. Fourth, the first non-parallel border 711 and the second non-parallel border 712 are non-concentric to the object. This has the advantageous effect that warped objects, in particular bowl-shaped and umbrella-shaped, come into contact with the first suction clamp 2104.1 as far as possible in what in FIG. 8*b* is the +y and −y direction from the centre of the first suction clamp 2104.1. This increases the pneumatic torque exerted on the object.

It is further noted that the first suction clamp 2104.1 and second suction clamp 2104.2 as shown in FIGS. 8*a*-8*b* are optimised for umbrella-shaped and bowl-shaped objects. In general, the warpage of the object is expected to be of quadratic shape in the x-direction and/or the y-direction. Warpage can be described as a first warpage value in the x-direction and a second warpage value in the y-direction. When both the first and second warpage value are positive, the object is bowl-shaped, i.e. a centre of the local object curvature is above the object. When both the first and second warpage value are negative, the object is umbrella-shaped, i.e. a centre of the local object curvature is below the object. A saddle-shaped object has a positive first warpage value in the x-direction and a negative second warpage value in y-direction, or vice versa. A halfpipe-shaped object only has one of the first and second warpage value being non-zero. Objects with shapes other than a bowl and umbrella can possibly touch the first suction clamp 2104.1 and/or second suction clamp 2104.2 at different locations. However, these objects are easier to clamp since the lack or reversed sign of warpage in one direction creates less local leakage along the circumference of the first suction clamp 2104.1 and/or second suction clamp 2104.2, and/or these objects are easier to deform due to less stress in the object.

Figure 9A:
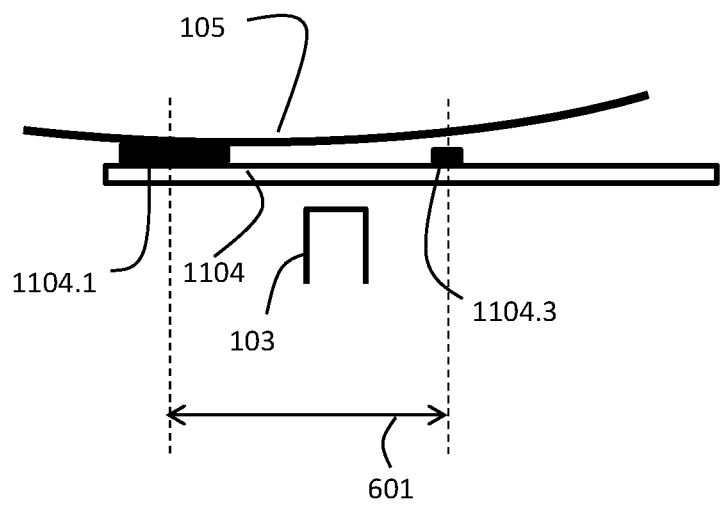
FIGS. 9a-9c illustrate a third aspect of the invention.
Figure 9B:
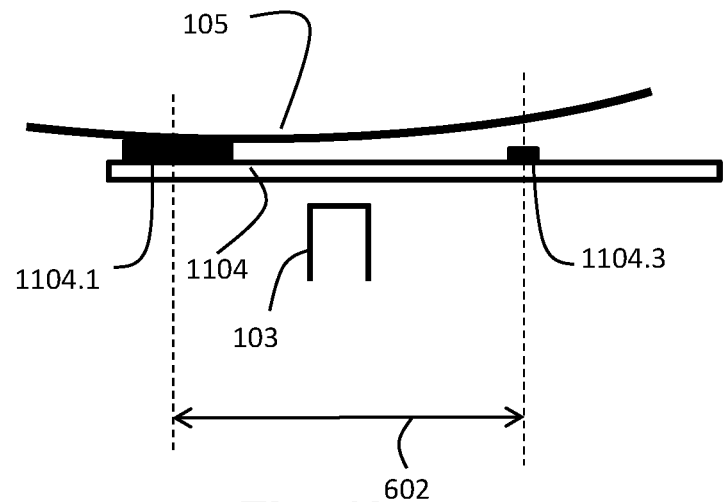
Figure 9C:
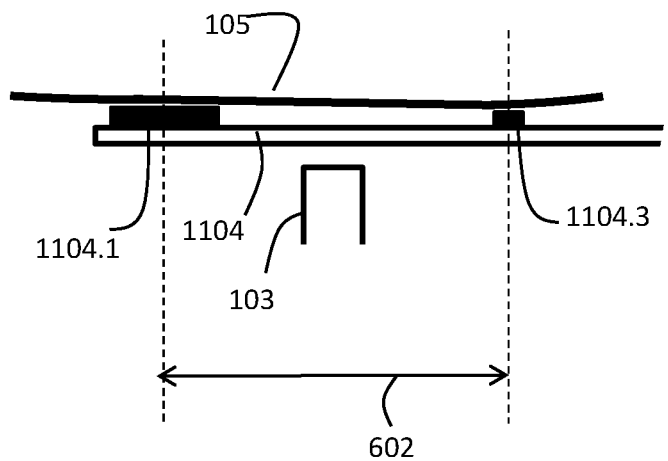

FIG. 9*a*, FIG. 9*b* and FIG. 9*c* further illustrate a third aspect of the invention. The third aspect may be combined with the first and/or second aspect, but this is not required.

FIG. 9*a* shows in side view the object gripper 1104 also shown in FIG. 7. The first suction clamp 1104.1—embodied according to the first aspect in this example—and the third suction clamp 1104.3 are visible. Also a support member 103 is visible, which may be part of a stage apparatus and may be adapted to engage the object 105 through the recess of the object gripper 1104.1.

FIG. 9*a* shows that a centre of the third suction clamp 1104.3 is arranged at a distance 601 from a centre of the first suction clamp 1104.1. The distance 601 corresponds with the conventional arrangement. As can be seen in FIG. 9*a*, this may lead to problems with a curved surface of a warped object 105. Because the object 105 is warped, the third suction clamp 1104.3 is not able to engage the object 105. A leak is formed as such, since ambient air is sucked in through the third suction clamp 1104.3. The suction force exerted on the object 105 is decreased and may not be sufficient to deform the object. Therefore, the object 105 may not be sufficiently clamped.

As shown in FIG. 9*b*, the third aspect of the invention therefore proposes to arrange the centre of the third suction clamp 1104.3 at a distance 602 of the centre of the first suction clamp 1104.1. The distance 602 is greater than the distance 601. For example, the distance 602 may be 25 mm larger than the distance 601. In an embodiment, the distance 602 may also be 20-30 mm larger than distance 601.

As the third suction clamp 1104.3 is arranged further from the first suction clamp, a distance from the third suction clamp 1104.3 upwards to the object 105 is actually larger in the situation shown in FIG. 9*b* when compared to the situation shown in FIG. 9*a*. However, because the distance 602 is larger than the distance 601, the deformation force required to deform the object 105 such that the third suction clamp 1104.3 is engaged, is smaller. A stiffness of the object 105 determines the required deformation force, which decreases as distance 602 increases, e.g. being inversely proportional to distance 602. Therefore, the situation shown in FIG. 9*c* can be achieved, where the third suction clamp 1104.3 is covered by the object 105. Once the object 105 is arranged on the third suction clamp 1104.3, the force required to keep the object 105 clamped thereon is much lower than the deformation force mentioned above, due to the flexibility of the object 105.

As can further be seen in FIG. 9*a*-9*c*, the third suction clamp 1104.3 is preferably smaller than the first suction clamp 1104.1, and possibly the second suction clamp 1104.2. Advantageously, a leak at the third suction clamp 1104.3 is smaller than at the first suction clamp 1104.1, and the suction force is higher, at least when the object 105 is in contact with the third suction clamp 1104.3 in at least one location. When the object 105 is clamped by the suction clamps 1104.1, 1104.2, 1104.3, the suction force exerted on the object 105 at the third suction clamp 1104.3 is thus higher than the suction force exerted on the object 105 at the first suction clamp 1104.1.

For example, conventional values may be that the object 105 has a stiffness of 50 N/mm, a radius of the third suction clamp 1104.3 may be about 17 mm, and an upward distance between the third suction clamp 1104.3 and the object 105 before clamping may be 0.7 mm, and a maximal suction force of the third suction clamp 1104.3 may be 5 N. Conventionally, distance 601 may then be approximately 130 mm. According to the third aspect, distance 602 may e.g. be increased to 155 mm.

The situation in FIG. 9*c* further ensures that the object 105 is relatively flat between the first suction clamp 1104.1 and the third suction clamp 1104.3. The height at which the support member 103 will engage the object 105 is, therefore, well defined. Consequently, the support member 103 can position the object 105 with high accuracy, e.g. on an object support of a stage apparatus.

The invention further relates to an object handler, comprising an object gripper according to one or more of the aspects of the invention, e.g. as shown in FIG. 7. The object handler may further comprise a suction device connected to the suction opening of the first suction clamp 1104.1, and/or the second suction clamp 1104.2, and/or the third suction clamp 1104.3. The object handler may further comprise the components as explained with reference the object handler 301 shown in FIG. 4*b*, in particular the robot arm 304 and the control unit 305.

The invention further relates to a stage apparatus for receiving an object. The stage apparatus may comprise one or more of the components of the stage apparatus 101 shown in FIG. 4*a*, such as the object support 102, the support member 103, etc. In an embodiment, the stage apparatus may comprises the object gripper or object handler according to the invention. In an embodiment, the support members 103 may be provided with a suction clamp according to the invention.

The invention further relates to a lithographic apparatus, which may comprise one or more of the components of the lithographic apparatus LA shown in FIG. 1, such as the projection system. The lithographic apparatus may further comprise the stage apparatus according to the invention.

Embodiments are provided according to the following clauses:

1. A suction clamp for clamping an object, comprising.
   a base structure comprising a base and a connection area,
   a first pad for receiving the object,
   a resilient member connecting the first pad to the connection area of the base structure such that the first pad is moveable relative to the base between a receiving position for receiving the object and a clamping position for clamping the object, wherein the resilient member is adapted to bias the first pad to the receiving position,
a suction opening arranged in the base and adapted to be connected to a suction device for providing a suction force for clamping the object on the first pad.

2. Suction clamp according to clause 1, further comprising a pressure drop member arranged to, when the suction force is provided via the suction opening, cause an inner pressure downstream of the pressure drop member to be lower than an ambient pressure upstream of the first pad.

3. Suction clamp according to clause 2, wherein the pressure drop member is arranged in a fixed position relative to the base, and wherein at least in the receiving position of the first pad a gap is present between the first pad and the pressure drop member.

4. Suction clamp according to clause 2 or clause 3, wherein the pressure drop member is arranged between the suction opening and the first pad.

5. Suction clamp according to clause 3 or 4, wherein the pressure drop member is arranged adjacent of the first pad, wherein in the clamping position of the first pad, said first pad and pressure drop member are adjoining.

6. Suction clamp according to any of the preceding clauses, wherein the first pad is a ring-shaped element, optionally circular or elliptically ring-shaped, and/or wherein the pressure drop member is a ring-shaped element, optionally circular or elliptically ring-shaped.

7. Suction clamp according to any of the preceding clauses, wherein the first pad comprises at least a first zone and a second zone, wherein the first zone is adapted to be able to move from the receiving position to the clamping position while the second zone remains in the receiving position.

8. Suction clamp according to any of the preceding clauses, wherein the base structure comprises a pad receiving area adapted to engage the first pad when the first pad is in the clamping position.

9. Suction clamp according to any of the preceding clauses, wherein a distance the first pad is adapted to move between the receiving position and the clamping position is less than 0.5 mm, preferably less than 0.3 mm, e.g. approximately 0.2 mm.

10. Suction clamp according to any of the preceding clauses, wherein the base structure comprises a first protrusion, wherein the first protrusion comprises the connection area.

11. Suction clamp according to any of the preceding clauses, wherein the first pad has an asymmetric shape which, when seen in top view of the suction clamp, comprises.
 a first end having a first centre of mass,
 a second end having a second non-parallel border and a second centre of mass,
 a middle part between the first end and the second end having a third centre of mass, the middle part having a first border part on a first side and a second border part on a second side,
 wherein, when seen in a direction from the first side to the second side, the third centre of mass is located between the first centre of mass and the second centre of mass and
 wherein the first end is convex shaped and the second end is concave shaped, and wherein the first end and the second end are adapted to be non-concentric to the object.

12. Object gripper comprising at least a first suction clamp according to any of the preceding clauses.

13. Object gripper according to clause 12, further comprising a second suction clamp according to any of the clauses 1-11, and a third suction clamp.

14. Stage apparatus for receiving an object, said stage apparatus comprising an object support, and an object gripper according to any of the clauses 12-13, wherein the object gripper is configured to arrange the object above the object support.

15. A lithographic apparatus comprising a stage apparatus according to clause 14 for receiving an object comprising a substrate, and a projection system for protecting a pattern onto the substrate.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A suction clamp for clamping an object, the suction clamp comprising:
   a base structure comprising a base and a connection area, wherein the base structure comprises a protrusion, the protrusion comprising the connection area,
   a pad for receiving the object, a portion of the pad located at a first side of the protrusion and another portion of the pad located at a second side of the protrusion located opposite of the first side across the protrusion,
   a resilient member connecting the pad to the protrusion of the base structure such that the pad is moveable relative to the base between a receiving position for receiving the object and a clamping position for clamping the object, wherein the resilient member is configured to bias the pad to the receiving position, and
   a suction opening arranged in the base and adapted to be connected to a suction device for providing a suction force for clamping the object on the pad.

2. The suction clamp according to claim 1, further comprising a pressure drop member arranged to, when the suction force is provided via the suction opening, cause an inner pressure downstream of the pressure drop member to be lower than an ambient pressure upstream of the pad.

3. The suction clamp according to claim 2, wherein the pressure drop member is arranged in a fixed position relative to the base, and wherein at least in the receiving position of the pad a gap is present between the pad and the pressure drop member.

4. The suction clamp according to claim 3, wherein the pressure drop member is arranged adjacent of the pad, wherein in the clamping position of the pad, the pad and pressure drop member are adjoining.

5. The suction clamp according to claim 2, wherein the pressure drop member is arranged between the suction opening and the pad.

6. The suction clamp according to claim 2, wherein the pressure drop member is a ring-shaped element.

7. The suction clamp according to claim 1, wherein the pad is a ring-shaped element.

8. The suction clamp according to claim 1, wherein the pad comprises at least a first zone and a second zone, wherein the first zone is adapted to be able to move from the receiving position to the clamping position while the second zone remains in the receiving position.

9. The suction clamp according to claim 1, wherein the base structure comprises a pad receiving area adapted to engage the pad when the pad is in the clamping position.

10. The suction clamp according to claim 1, wherein a distance the pad is adapted to move between the receiving position and the clamping position is less than 0.5 mm.

11. The suction clamp according to claim 1, wherein the pad has an asymmetric shape which, when seen in top view of the suction clamp, comprises:
    a first end having a first centre of mass,
    a second end having a second non-parallel border and a second centre of mass,
    a middle part between the first end and the second end having a third centre of mass, the middle part having a first border part on a first side and a second border part on a second side,
    wherein, when seen in a direction from the first side to the second side, the third centre of mass is located between the first centre of mass and the second centre of mass and
    wherein the first end is convex shaped and the second end is concave shaped, and
    wherein the first end and the second end are adapted to be non-concentric to the object.

12. An object gripper comprising at least a first suction clamp according to claim 1.

13. The object gripper according to claim 12, further comprising a second suction clamp, and a third suction clamp, the second suction clamp comprising:
    a base structure for the second suction clamp comprising a base and a connection area, wherein the base structure for the second suction clamp comprises a protrusion, the protrusion for the second suction clamp comprising the connection area for the second suction clamp,
    a pad for the second suction clamp for receiving the object,
    a resilient member for the second suction clamp connecting the pad for the second suction clamp to the protrusion of the base structure for the second suction clamp such that that pad is moveable relative to the base for the second suction clamp between a receiving position for receiving the object and a clamping position for clamping the object, wherein the resilient member for the second suction clamp is configured to bias the pad for the second suction clamp to the receiving position, and
    a suction opening for the second suction clamp arranged in the base for the second suction clamp and adapted to be connected to a suction device for providing a suction force for clamping the object on the pad for the second suction clamp.

14. A stage apparatus for receiving an object, the stage apparatus comprising:
    an object support, and
    the object gripper according to claim 12,
    wherein the object gripper is configured to arrange the object above the object support.

15. A lithographic apparatus comprising the stage apparatus according to claim 14 for receiving an object comprising a substrate, and a projection system for projecting a pattern onto the substrate.

16. The stage apparatus according to claim 14, further comprising a pressure drop member arranged to, when the suction force is provided via the suction opening, cause an inner pressure downstream of the pressure drop member to be lower than an ambient pressure upstream of the pad.

17. The stage apparatus according to claim 14, wherein the pad is a ring-shaped element.

18. The stage apparatus according to claim 14, wherein the pad comprises at least a first zone and a second zone, wherein the first zone is adapted to be able to move from the receiving position to the clamping position while the second zone remains in the receiving position.

19. The stage apparatus according to claim 14, wherein the base structure comprises a pad receiving area adapted to engage the pad when the pad is in the clamping position.

20. A suction clamp for clamping an object, the suction clamp comprising:
    a base structure comprising a base and a connection area, wherein the base structure comprises a protrusion, the protrusion comprising the connection area,
    a pad for receiving the object, a resilient member connecting the pad to the protrusion of the base structure such that the pad is moveable relative to the base between a receiving position for receiving the object and a clamping position for clamping the object, wherein the resilient member is configured to bias the pad to the receiving position and wherein the resilient member is configured to flex a part of the pad relative to another part of the pad, and a suction opening arranged in the base and adapted to be connected to a suction device for providing a suction force for clamping the object on the pad.

* * * * *